US006042898A

United States Patent [19]
Burns et al.

[11] Patent Number: 6,042,898
[45] Date of Patent: Mar. 28, 2000

[54] METHOD FOR APPLYING IMPROVED DURABILITY THERMAL BARRIER COATINGS

[75] Inventors: Steven M. Burns, Waterbury; Robert J. Meehan, Wolcott, both of Conn.

[73] Assignee: United Technologies Corporation, Hartford, Conn.

[21] Appl. No.: 09/211,754

[22] Filed: Dec. 15, 1998

[51] Int. Cl.[7] .................................. C23C 14/02
[52] U.S. Cl. ..................... 427/534; 427/540; 427/454; 427/248.1
[58] Field of Search .................................. 427/534, 540, 427/566, 454, 248.1

[56] References Cited

U.S. PATENT DOCUMENTS

| | | | |
|---|---|---|---|
| Re. 32,121 | 4/1986 | Gupta et al. ............................. | 428/656 |
| 3,071,490 | 1/1963 | Pevar ...................................... | 427/540 |
| 4,321,310 | 3/1982 | Ulion et al. ............................. | 428/612 |
| 4,321,311 | 3/1982 | Strangman .............................. | 428/623 |
| 4,328,257 | 5/1982 | Muehlberger et al. .................. | 427/34 |
| 4,401,697 | 8/1983 | Strangman .............................. | 427/250 |
| 4,405,659 | 9/1983 | Strangman ........................... | 427/248.1 |
| 4,405,660 | 9/1983 | Ulion et al. ........................... | 427/248.1 |
| 4,414,249 | 11/1983 | Ulion et al. ........................... | 427/248.1 |
| 4,449,714 | 5/1984 | Meier ........................................... | 277/9 |
| 4,585,481 | 4/1986 | Gupta et al. ........................ | 106/14.05 |
| 4,676,994 | 6/1987 | Demary .................................... | 427/566 |
| 4,689,468 | 8/1987 | Muehlberger ..................... | 219/121 PL |
| 4,741,973 | 5/1988 | Condit et al. ........................... | 428/553 |
| 5,262,245 | 11/1993 | Ulion et al. ............................. | 428/469 |
| 5,277,936 | 1/1994 | Olson et al. ............................. | 427/453 |
| 5,298,835 | 3/1994 | Muehlberger et al. ............ | 315/111.21 |
| 5,375,075 | 12/1994 | Ogata et al. ............................. | 364/580 |
| 5,472,487 | 12/1995 | Chin et al. .......................... | 106/287.11 |
| 5,643,343 | 7/1997 | Selifanov et al. ........................ | 51/306 |
| 5,652,044 | 7/1997 | Rickerby ................................ | 428/216 |
| 5,711,773 | 1/1998 | Selifanov et al. ........................ | 51/306 |
| 5,792,521 | 8/1998 | Wortman ................................. | 427/566 |

FOREIGN PATENT DOCUMENTS

| | | | |
|---|---|---|---|
| 1-139749 | 6/1989 | Japan ..................................... | 427/540 |
| 1-139751 | 6/1989 | Japan ..................................... | 427/540 |

OTHER PUBLICATIONS

Herman, H. and Sampath, S., The Thermal Spray Laboratory, Department of Materials Science and Engineering State University of New York: *Thermal Spray Coatings*, 15 pages. (no date).

*Primary Examiner*—Katherine A. Bareford
*Attorney, Agent, or Firm*—George J. Romanik

[57] ABSTRACT

A thermal barrier coating may be applied by depositing a MCrAlY bond coat onto a superalloy substrate, wherein M stands for Ni, Co, Fe, or a mixture of Ni and Co. Undesired oxides and contaminants are removed from the MCrAlY bond coat with an ionized gas stream cleaning process, such as a reverse transfer arc process. An adherent aluminum oxide scale is formed on the MCrAlY bond coat and a ceramic layer is deposited on the aluminum oxide scale by physical vapor deposition to form a columnar structure.

11 Claims, 1 Drawing Sheet

METHOD FOR APPLYING IMPROVED DURABILITY THERMAL BARRIER COATINGS

TECHNICAL FIELD

The present invention is directed to thermal barrier coatings, particularly thermal barrier coatings for gas turbine engines.

BACKGROUND ART

As aircraft operators and manufactures demanded more powerful and efficient engines over the years, engine manufacturers responded by developing gas turbine engines that operate at higher temperatures and pressures. As a result, high-pressure turbine vanes and blades in modern gas turbine engines are often exposed to temperatures near or above the melting point of the superalloys from which they are made. To permit high operating temperatures while preserving the integrity and extending the life of high pressure turbine vanes and blades, engine manufacturers often protect them with multi-layer thermal barrier coatings that comprise an oxidation resistant metallic bond coat and a ceramic layer.

Such coatings are frequently applied to gas turbine engine components by first depositing a metallic bond coat on the part to be protected. After a peening step, which may be optional in some cases, and a cleaning step, the ceramic layer is deposited over the bond coat by electron beam physical vapor deposition (EB-PVD) or another physical vapor deposition method. As part of an EB-PVD process, parts to be coated are placed inside a coating chamber operated at a high vacuum. An electron beam gun inside the coating chamber is magnetically focused on ingots of a ceramic material, for example a mixture of zirconium oxide and yttrium oxide, that has a melting point of more than 4500° F. (2480° C.). The electron beam's energy melts and then vaporizes the ceramic. As the parts to be coated rotate above the ceramic ingots, the vaporized ceramic condenses on the parts, forming the ceramic layer.

Through careful control of operating conditions, a specific and very desirable coating structure, a series of closely packed ceramic columns, and an adherent aluminum oxide scale can be obtained. The ceramic material and the EB-PVD coating process used to make the ceramic layer gives the thermal barrier coating superior thermal insulating properties. The durability of this coating is obtained from the ceramic columnar structure and chemical bond provided by the aluminum oxide scale. This unique columnar structure provides a stress tolerant mechanism to compensate for stresses generated from the difference in thermal expansion coefficients between a metallic turbine component and the ceramic top coat. Coatings like this are described in commonly assigned U.S. Pat. Nos. 4,321,310 to Ulion et al., 4,321,311 to Strangman, 4,401,697 to Strangman, 4,405,659 to Strangman, 4,405,660 to Ulion et al., and 4,414,249 to Ulion et al.

Although such coatings have been used successfully in a variety of applications, there is a constant search for ways to improve the durability of these coatings. Therefore, what is needed in the industry are methods for improving the durability of thermal barrier coatings having columnar structures.

DISCLOSURE OF THE INVENTION

The present invention is directed towards a method for improving the durability of thermal barrier coatings having columnar structures.

The invention includes a method for applying a thermal barrier coating by depositing a MCrAlY bond coat onto a superalloy substrate, wherein M stands for Ni, Co, Fe, or a mixture of Ni and Co. Undesired oxides and contaminants are removed from the MCrAlY bond coat with an ionized gas stream cleaning process. An adherent aluminum oxide scale is formed on the MCrAlY bond coat and a ceramic layer is deposited on the aluminum oxide scale by physical vapor deposition to form a columnar structure.

These and other features and advantages of the present invention will become more apparent from the following description and accompanying drawing.

BEST MODE FOR CARRYING OUT THE INVENTION

The thermal barrier coating of the present invention may be deposited onto a variety of gas turbine engine component substrates, which are typically made from a nickel or cobalt base superalloy. Most frequently, the thermal barrier coating of the present invention will be applied to high-pressure turbine vanes or blades. For simplicity, this application will describe the application of the thermal barrier coating of the present invention to a high-pressure turbine blade. One skilled in the art, however, will appreciate that the invention as described is equally applicable to any other gas turbine engine part that would benefit from a thermal barrier coating.

Figure 1:
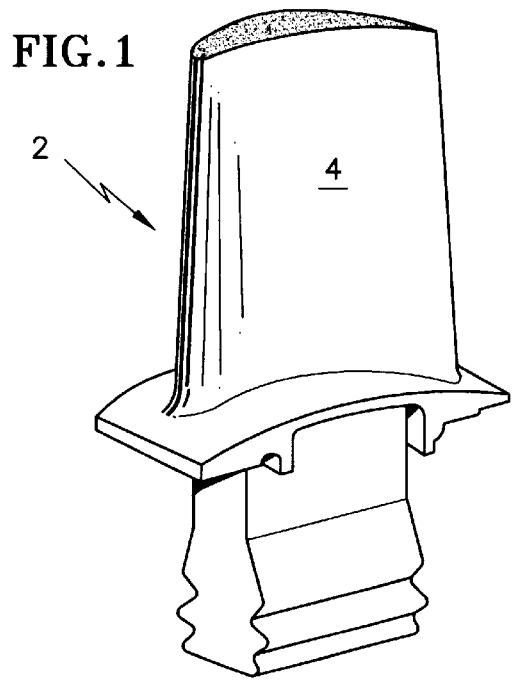
FIG. 1 is a perspective view of a turbine blade having a thermal barrier coating of the present invention.
Figure 2:
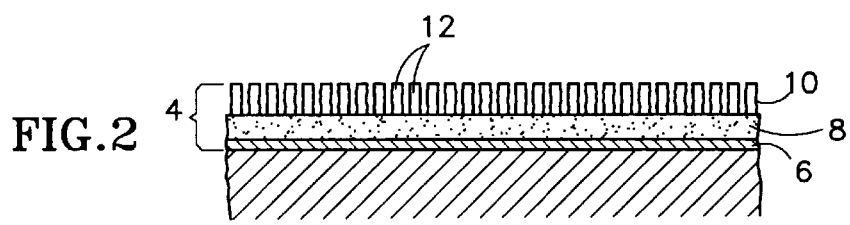
FIG. 2 is a view of a thermal barrier coating of the present invention.

FIG. 1 shows a turbine blade 2 having a thermal barrier coating 4 of the present invention. As FIG. 2 shows, the thermal barrier coating 4 comprises a metallic bond coat 6, an aluminum oxide ($Al_2O_3$) layer 8 on the bond coat 6, and a columnar grain zirconium oxide ($ZrO_2$) ceramic layer 10 deposited on the aluminum oxide layer 8. The thermal barrier coating of the present invention may be deposited directly onto the blade 2 as shown or may be deposited over an undercoating on or diffused into the surface of the blade 2. For example, the thermal barrier coating of the present invention may be deposited over a diffusion aluminide coating diffused into the surface of the blade 2.

The bond coat 6 provides good adhesion between the thermal barrier coating 4 of the present invention and turbine blade 2 by providing a good surface for forming the aluminum oxide layer 8 and applying the ceramic layer 10. Appropriate selection of a bond coat 6 will limit or prevent coating failure by spalling of the ceramic layer 10 from the bond coat 6 or spalling of the entire thermal barrier coating 4 during engine operation. Spalling of the ceramic layer or the entire thermal barrier coating 4 during operation can decrease turbine blade 2 life.

The metallic bond coat 6 of the present invention may be any metallic material known in the art that can form a durable bond between a turbine blade 2 and ceramic layer 10. Such materials typically comprise sufficient Al to form an adherent layer of aluminum oxide that provides a good bond with the columnar ceramic 10. For example, the metallic bond coat 6 may comprise a diffusion aluminide, including an aluminide that comprises one or more noble metals; an alloy of Ni and Al; or a MCrAlY, wherein the M stands for Fe, Ni, Co, or a mixture of Ni and Co. As used in this application, the term MCrAlY also encompasses compositions that include additional elements or combinations of elements such as Si, Hf, Ta, Re or noble metals as is known in the art. The MCrAlY also may include a layer of diffusion aluminide, particularly an aluminide that comprises one or more noble metals. Preferably, the metallic bond coat 6 will comprise a MCrAlY of the nominal composition Ni-22Co-17Cr-12.5Al-0.25Hf-0.4Si-0.6Y, by weight. This composition is further described in commonly assigned U.S. Pat. Nos. 4,585,481 and Re 32,121, both to Gupta et al., both of which are incorporated by reference.

The metallic bond coat 6 may be deposited by any method known in the art for depositing such materials. For example, the bond coat 6 may be deposited by low pressure plasma spray (LPPS), electron beam physical vapor deposition (EB-PVD), electroplating, cathodic arc, or any other method. The metallic bond coat 6 should be applied to the blade 2 to a thickness sufficient to provide a strong bond between the blade 2 and columnar ceramic layer 10 and to prevent cracks that develop in the columnar ceramic layer 10 from propagating into the blade 2. For most applications, the metallic bond coat 6 may be about 1 mil (25 $\mu$m) to about 10 mils (250 $\mu$m) thick. Preferably, the bond coat 6 will be about 1 mil (25 $\mu$m) to about 3 mils (75 $\mu$m) thick. After depositing the metallic bond coat 6, it may be desirable to peen the bond coat 6 to close porosity or leaders that may have developed during deposition or to perform other mechanical or polishing operations to prepare the bond coat 6 to receive the columnar ceramic layer 10.

After peening or any other surface preparation step, the bond coat 6 should be cleaned to remove oil, other organic or carbon-forming contaminants, surface oxides, and other adherent contaminants. Typical prior art cleaning methods include a thermal cycle at elevated temperature, for example about 1300° F. (704° C.) to about 1500° F. (816° C.) for about 25 minutes to about 45 minutes, in an oxidizing atmosphere to carbonize oils and other contaminants (e.g., dye penetrate fluids, machining lubrication oils, EDM oils, etc.) followed by mechanical cleaning, for example by grit blasting, vapor/slurry blasting, and/or ultrasonic cleaning, to remove embedded surface oxides and other undesired adherent contaminants. I have found that coating life can be improved by 50% or more by following such prior art cleaning processes with an ionized gas stream cleaning process, such as reverse transfer arc cleaning.

Ionized gas stream cleaning involves placing the blade 2 to be cleaned into a vacuum chamber, reducing the pressure inside the vacuum chamber, flowing an inert gas into the vacuum chamber, and striking an arc between an electrode and the blade 2. The arc superheats oxides and other contaminants on the blade's surface, causing the oxides and contaminants to vaporize. Preferably, the ionized gas stream cleaning process will be performed at pressures of about 30 torr absolute (4.0 kPa) to about 40 torr absolute (5.3 kPa) and temperatures of about 1400° F. (760° C.) to about 1600° F. (871° C.). Most preferable, the ionized gas stream cleaning process will be performed at pressures of about 35 torr absolute (4.7 kPa) and temperatures of about 1500° F. (816° C.). Suitable inert gases include, helium, argon, or mixtures of helium and argon. The arc may be struck in any convenient way, preferably by establishing the blade 2 as a negative electrode and providing a positive electrode inside the vacuum chamber. A potential of about 165 V to about 150 V at about 0 amps between the blade 2 and positive electrode may be used in the process. Once the arc is established, it may be maintained with a potential of about 30 V to about 40 V at about 75 amps to about 125 amps. Preferably, however, the initial potential will be about 160 V at about 0 amps, stepping down to about 35 V at about 100 amps to maintain a continues ionized gas stream cleaning process. To ensure effective cleaning, the ion gas stream cleaning process should last for a time suitable for vaporizing contaminates from the blade's 2 surface. The cleaning time is a variable based on part size and surface area. Typical times can vary from about 1 minute to about 3 minutes.

The ionized gas stream cleaning process (e.g., reverse transfer arc process) may take place in any convenient device, for example a vacuum chamber external to an EB-PVD coater or inside the EB-PVD coater itself. If the process is performed outside the EB-PVD coater, proper precautions, such as handling the cleaned blade 2 with gloves and bagging the cleaned blade 2, should be followed to prevent the blade 2 from acquiring additional contaminants after cleaning. The desirability for such precautions may be obviated by performing the reverse transfer arc cleaning process inside the EB-PVD coater itself, for example inside a load lock or the coating chamber.

After cleaning, the aluminum oxide layer 8, sometimes referred to as thermally grown oxide, may be formed on the metallic bond coat 6 by any method that produces a uniform, adherent layer. Although the aluminum oxide layer 8 is optional, it is strongly preferred. For example, the aluminum oxide layer 8 may be formed by oxidation of Al in the metallic bond coat 6 at an elevated temperature before the application of the columnar ceramic layer 10. Alternately, the aluminum oxide layer 8 may be deposited by chemical vapor deposition or any other suitable deposition method know in the art. The thickness of the aluminum oxide layer 8 may vary based its density and homogeneity. Preferably, the aluminum oxide layer 8 will be about 0.004 mils (0.1 $\mu$m) to about 0.4 mils (10 $\mu$m) thick.

The columnar ceramic layer 10 may comprise any ceramic material that is compatible with the bond coat and demonstrates acceptable phase stability at the temperatures at which the blade 2 will be used. For example, the columnar ceramic layer 10 may comprise partially or fully stabilized zirconium oxide ($ZrO_2$), cerium oxide ($CeO_2$), magnesium oxide (MgO), or calcium oxide (CaO). Preferably, the columnar ceramic layer 10 will comprise a mixture of zirconium oxide and a stabilizer such as yttrium oxide ($Y_2O_3$), magnesium oxide (MgO), calcium oxide (CaO), or a mixture thereof. Yttrium oxide is the preferred stabilizer. The columnar ceramic layer 10 should include enough stabilizer to prevent an undesirable zirconium oxide phase change (i.e. a change from a preferred tetragonal or cubic crystal structure to the less desired monoclinic crystal structure) over the range of operating temperature likely to be experienced in a particular gas turbine engine. Preferably, the columnar ceramic layer 10 will comprise a mixture of zirconium oxide and about 3 wt % to about 25 wt % yttrium oxide. Most preferably, the columnar ceramic layer 10 will comprise about 6 wt % to about 8 wt % yttrium oxide or about 11 wt % to about 13 wt % yttrium oxide, depending on the intended temperature range.

As FIG. 2 shows, the columnar ceramic layer 10 should have a plurality of columnar segments 12 homogeneously dispersed throughout the columnar ceramic layer 10 such that a cross-section of the columnar ceramic layer 10 normal to the surface to which the columnar ceramic layer 10 is applied exposes a columnar microstructure typical of physical vapor deposited coatings. The columnar structure should have a length that extends for the full thickness of the columnar ceramic layer 10. Such coatings are described in commonly assigned U.S. Pat. Nos. 4,321,310 to Ulion et al., 4,321,311 to Strangman, 4,401,697 to Strangman, 4,405,659 to Strangman, 4,405,660 to Ulion et al., 4,414,249 to Ulion et al., and 5,262,245 to Ulion et al., all of which are incorporated by reference.

The columnar ceramic layer 10 may be deposited by EB-PVD or any other physical vapor deposition method known to deposit columnar coating structures. Preferably, the columnar ceramic layer 10 of the present invention will be applied by EB-PVD because of the availability of EB-PVD equipment and skilled technicians. As discussed above, the columnar ceramic layer 10 may be applied over a metallic bond coat 6, preferably in conjunction with an aluminum oxide layer 8. The columnar ceramic layer 10 should be applied a thickness sufficient to provide a strong bond with the surface to which it is applied. For most applications, the columnar ceramic layer 10 may be about 5 mils (125 $\mu$m) to about 50 mils (1250 $\mu$m) thick. Preferably, the columnar ceramic layer 10 will be about 5 mils (125 $\mu$m) to about 25 mils (625 $\mu$m) thick.

The following examples demonstrates the present invention without limiting the invention's broad scope.

EXAMPLE 1

Prior Art

To develop baseline data, a thermal barrier coating was applied to five cylindrical burner rig bars by a prior art method. The burner rig bars, which comprised a nickel base superalloy with a nominal composition of Ni-5Cr-10Co-1.9Mo-5.9W-3Re-8.7Ta-5.6Al-0.1Hf, by weight, were 0.46 inch (1.18 cm) in diameter and 4.30 inch (10.92 cm) long. First, a metallic bond coat about 3 mils (75 $\mu$m) thick that nominally comprised Ni-22Co-17Cr-12.5Al-0.25Hf-0.4Si-0.6Y, by weight, was deposited by low pressure plasma spray. The metallic bond coat was then diffusion heat treated at about 1975° F. (1079° C.) and peened by gravity assist shot peening. After peening, the burner rig bars were placed in a furnace and heated to 1300° F. (704° C.) for 30 minutes to carbonize any oils and other contaminants. The bars were then grit blasted with 240 mesh (>60 $\mu$m) aluminum oxide grit to remove surface oxides and other adherent contaminants. A TGO layer about 0.04 mil (1 $\mu$m) thick was grown on the surface of the bond coat by conventional means. Finally about 10 mils (250 $\mu$m) of columnar ceramic comprising zirconium oxide stabilized with 7 wt % yttrium oxide were applied by a conventional electron beam physical vapor deposition process. The coated bars were tested in a burner rig device that rotated the bars at a high speed in a flame produced by burning jet aircraft grade fuel. The bars were heated in the flame to about 2100° F. (1150° C.) for about 57 minutes and then removed from the flame and force air cooled for about 3 minutes. All bars were periodically inspected and the life of the coatings were measured in terms of number of hours to coating spallation. The lives of the five samples were averaged to provide a baseline reference point and to provide a basis for normalizing test data. The normalized data, expressed as relative life, are presented in Table 1 below.

TABLE 1

| Sample | Relative Life |
|---|---|
| 1 | 1.376 |
| 2 | 0.532 |
| 3 | 0.417 |
| 4 | 1.640 |
| 5 | 1.037 |
| Example 1 Average ("A") | 1.000 |
| Example 1 Standard Deviation | 0.527 |

EXAMPLE 2

Present Invention

A thermal barrier coating was applied to five cylindrical burner rig bars as in Example 1 up through the grit blasting step. Following grit blasting, the bars were placed inside the chamber of a low pressure plasma spray coater and the pressure was reduced about 35 torr (4.7 kPa). The electrode in the plasma spray coater was used to strike an arc between the negatively charged bar and positively charged electrode to initiate the ionized gas stream cleaning process at a potential of about 160 V and about 0 amps. The potential was then stepped down to about 5 V at about 100 amps to maintain the arc. After a one minute cleaning, the bars were removed from the low pressure plasma spray coater and placed in a sealed bag for transport to an EB-PVD coater. After being placed inside the EB-PVD coater, the aluminum oxide layer and ceramic layer were formed and the bars were tested as in Example 1. The normalized data, again expressed as relative life, are presented in Table 2 below.

TABLE 2

| Sample | Relative Life |
|---|---|
| 6 | 1.695 |
| 7 | 1.630 |
| 8 | 1.782 |
| 9 | 1.640 |
| 10 | 1.211 |
| Example 2 Average ("B") | 1.591 |
| Example 2 Standard Deviation | 0.221 |

Figure 3:
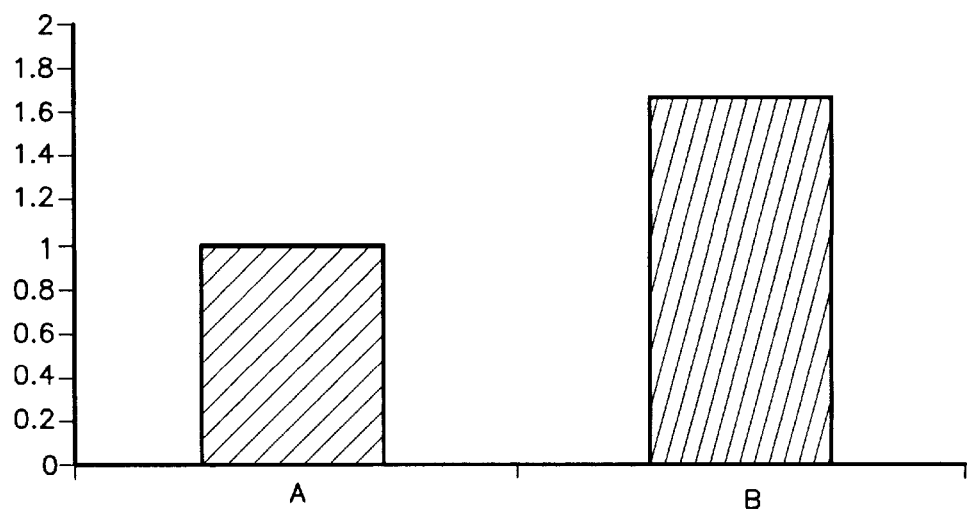
FIG. 3 is a graph that compares the thermal barrier coating of the present invention with a prior art thermal barrier coating.

As can be seen from FIG. 3, which compares the baseline reference point ("A," i.e., the normalized average life from Example 1) and the normalized average life ("B") from Example 2, coatings made by the method of the present invention surprising have a nearly 60% improvement in life compared with coatings made by the prior art method. Just as important and unexpected, the relative lives of the coatings of the present invention are much more consistent, as shown by a lower standard deviation, than coatings made by the prior art method. More consistent coating life is beneficial because it can lead to reduced design allowances that lower manufacturing costs while maintaining anticipated coating reliability.

The invention is not limited to the particular embodiments shown and described in this specification. Various changes and modifications may be made without departing from the spirit or scope of the claimed invention.

We claim:

1. A method for applying a thermal barrier coating, comprising the steps of:

a. depositing a MCrAlY bond coat onto a superalloy substrate, wherein M stands for Ni, Co, Fe, or a mixture of Ni and Co;

b. removing undesired oxides and contaminants from the MCrAlY bond coat with an ionized gas stream cleaning process by placing the MCrAlY-coated substrate into a vacuum chamber, reducing the pressure inside the vacuum chamber, flowing an inert gas into the vacuum chamber, and striking and maintaining an arc between the MCrAlY-coated substrate and an electrode;

c. forming an adherent aluminum oxide scale on the MCrAlY bond coat; and d. depositing a ceramic layer having a columnar structure on the aluminum oxide scale by physical vapor deposition.

2. The method of claim 1, wherein the substrate is a high pressure turbine vane or blade from a gas turbine engine.

3. The method of claim 1, wherein the MCrAlY has a nominal composition of 22Co-17Cr-12.5Al-0.25Hf0.4Si-0.6Y, balance Ni, expressed in weight percent.

4. The method of claim 1, wherein the substrate includes a surface modification layer comprising a diffusion aluminide.

5. The method of claim 1, further comprising between steps a and b:

a'. heating the substrate to about 1300° F. (704° C.) to about 1500° F. (816° C.) for about 25 minutes to about 40 minutes to carbonize oils and other contaminants; and a". mechanically cleaning the substrate to remove embedded surface oxides and other adherent contaminants.

6. The method of claim 1, wherein the ionized gas stream cleaning process is performed at pressures between about 30 torr absolute (4.0 kPa) and about 40 torr absolute (5.3 kPa) and temperatures of about 1400° F. (760° C.) and about 1600° F. (871° C.).

7. The method of claim 1, wherein the inert gas comprises helium, argon, or a mixture of helium and argon.

8. The method of claim 1, wherein the arc is struck with a potential of about 165 V to about 150 V at about 0 amps and maintained with a potential of about 30 V to about 40 V at about 75 amps to about 125 amps.

9. The method of claim 1, wherein the ionized gas stream cleaning process is performed outside a physical vapor deposition coater.

10. The method of claim 1, wherein the ionized gas stream cleaning process is performed inside a coating chamber of a physical vapor deposition coater.

11. The method of claim 1, wherein the ceramic layer comprises zirconium oxide and about 3 wt % to about 25 wt % of a stabilizer selected from the group consisting of yttrium oxide, magnesium oxide, calcium oxide, and a mixture thereof.

* * * * *